United States Patent [19]
Su et al.

[11] Patent Number: 6,093,617
[45] Date of Patent: Jul. 25, 2000

[54] PROCESS TO FABRICATE HEMISPHERICAL GRAIN POLYSILICON

[75] Inventors: Chung-Hui Su, Chinchu; Mong-Song Liang, Hsin-Chu, both of Taiwan

[73] Assignee: Taiwan Semiconductor Manufacturing Company, Hsin-Chu, Taiwan

[21] Appl. No.: 08/858,108

[22] Filed: May 19, 1997

[51] Int. Cl.[7] .............................................. H01L 21/8242
[52] U.S. Cl. ........................ 438/398; 438/253; 438/255; 438/396
[58] Field of Search ................................... 438/255, 398, 438/253, 396, 254, 397; 257/309

[56] References Cited

U.S. PATENT DOCUMENTS

| | | | |
|---|---|---|---|
| 5,554,557 | 9/1996 | Koh | 438/398 |
| 5,583,070 | 12/1996 | Liao et al. | 437/52 |
| 5,597,754 | 1/1997 | Lou et al. | 438/398 |
| 5,618,747 | 4/1997 | Lou | 438/398 |
| 5,639,685 | 6/1997 | Zahurak et al. | 438/398 |
| 5,663,085 | 9/1997 | Tanigawa | 438/398 |
| 5,691,228 | 11/1997 | Ping et al. | 438/398 |
| 5,856,007 | 1/1999 | Sharan et al. | 438/398 |

OTHER PUBLICATIONS

Watanabe et al, "Hemispherical Grain Silicon for High Density DRAMS," Solid State Technology, Jul. 1992, pp. 29–33.

Wolf et al., "Chemical Vapor Deposition of Amorphous and Polycrystalline Films", Silicon Processing For the VLSI Era: Process Technology—vol. 1, pp. 177–178, 181–182, 1986.

*Primary Examiner*—Carl Whitehead, Jr.
*Assistant Examiner*—Toniae M. Thomas
*Attorney, Agent, or Firm*—George O. Saile; Stephen B. Ackerman

[57] ABSTRACT

A process for forming HSG polysilicon has been developed. The process features initially depositing an amorphous silicon layer, at a temperature between about 490 to 550° C. The amorphous silicon layer is then subjected to an in situ anneal procedure, at a temperature between about 600 to 650° C., and at a pressure between about 0.5 to 1.5 mTorr, for about 30 min, to convert the amorphous silicon layer to a HSG polysilicon layer. The surface roughness of the HSG polysilicon, when used as the top layer of a storage node structure, of a stacked capacitor structure, results in a surface area increase of about 50%, thus offering increases in capacitance.

11 Claims, 2 Drawing Sheets

6,093,617

PROCESS TO FABRICATE HEMISPHERICAL GRAIN POLYSILICON

BACKGROUND OF THE INVENTION (1) Field of the Invention

The present invention relates to semiconductor fabrication processes used to create hemispherical grain polysilicon.

(2) Description of Prior Art

The ability to fabricate polysilicon, exhibiting hemispherical grains, has found several applications in semiconductor chips. However the primary application for hemispherical grain, (HSG), polysilicon, has been its use in dynamic random access memory, (DRAM), devices. DRAM devices, using a stacked capacitor structure, (STC), is capacitance limited, by the dimensions of the capacitor. The STC structure, overlying a transfer gate transistor, is limited in area to the dimension of the underlying transistor structure. Therefore to obtain greater capacitance for DRAMs using the STC structure, the semiconductor industry has attempted to increase the surface area of the storage node, or lower electrode, of the STC structure, without increasing the area used by the STC structure. This has been accomplished via use of a lower electrode, comprised of a roughened silicon surface. The roughened silicon surface, supplies a greater surface area than counterparts with smooth surfaces.

One method for obtaining roughened silicon surfaces, has been the use of HSG polysilicon. HSG polysilicon surfaces are characterized by concave and convex features, thus resulting in an increase in surface area. However the magnitude of the surface area increase, and thus the increase in STC capacitance, is a function of the degree of roughness of the HSG polysilicon. Watanabe, et al, in an article, "Hemispherical Grain Silicon for High Density DRAMS, in SOLID STATE TECHNOLOGY, July 1992, pages 29–33, describe a method of directly depositing HSG polysilicon, without the use of a subsequent anneal step. However that process demands a narrow temperature range needed for attainment of HSG polysilicon. Liao, et al, in U.S. Pat. No. 5,583,070, describe a DRAM device, using an STC structure, in which an HSG polysilicon layer, again supplies the top surface for the lower electrode of the STC structure. In this invention an amorphous layer of polysilicon is first deposited, followed by an in situ anneal, resulting in the HSG polysilicon.

The present invention will describe a process for producing HSG polysilicon, using a specific, and unique set of deposition and anneal conditions, different than conditions described in the prior art. The use HSG polysilicon, used as part of the lower electrode of a STC structure, and obtained using the conditions described in this invention, increase the capacitance of of a plane plate test structure, by about 100%, when compared to counterparts fabricated without the use of the HSG polysilicon layer, described in this invention. This HSG polysilicon layer, when used for either 4 Mb, or 16 Mb, DRAM cells, result in capacitance increases of about 50%, when compared to counterpart DRAM devices, fabricated without HSG polysilicon.

SUMMARY OF THE INVENTION

It is an object of this invention to create a hemispherical grained polysilicon layer, via a combination of a unique set of deposition conditions, followed by in situ anneal procedures.

It is another object of this invention to use the hemispherical grained polysilicon as a top layer for a storage node electrode, for a capacitor structure used in a DRAM device.

In accordance with the present invention a process for obtaining hemispherical grain polysilicon, and a process for incorporating the HSG polysilicon in a capacitor structure of a DRAM device, is described. A transfer gate transistor, used for a DRAM device is supplied. A storage node contact hole is opened in an insulator layer, exposing the top surface of a source and drain region of the transfer gate transistor. A first polysilicon layer, to be used as the bottom part of the storage node electrode is deposited, followed by the creation of the overlying hemispherical grain polysilicon, overlying the first polysilicon layer. Patterning of the storage node electrode, comprised of an overlying hemispherical grain polysilicon layer, on the underlying first polysilicon layer, is followed by the formation of a capacitor dielectric layer, traversing the hemispherical grain polysilicon layer. Another layer of polysilicon is deposited and patterned, creating the upper electrode, or cell plate, of the capacitor structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
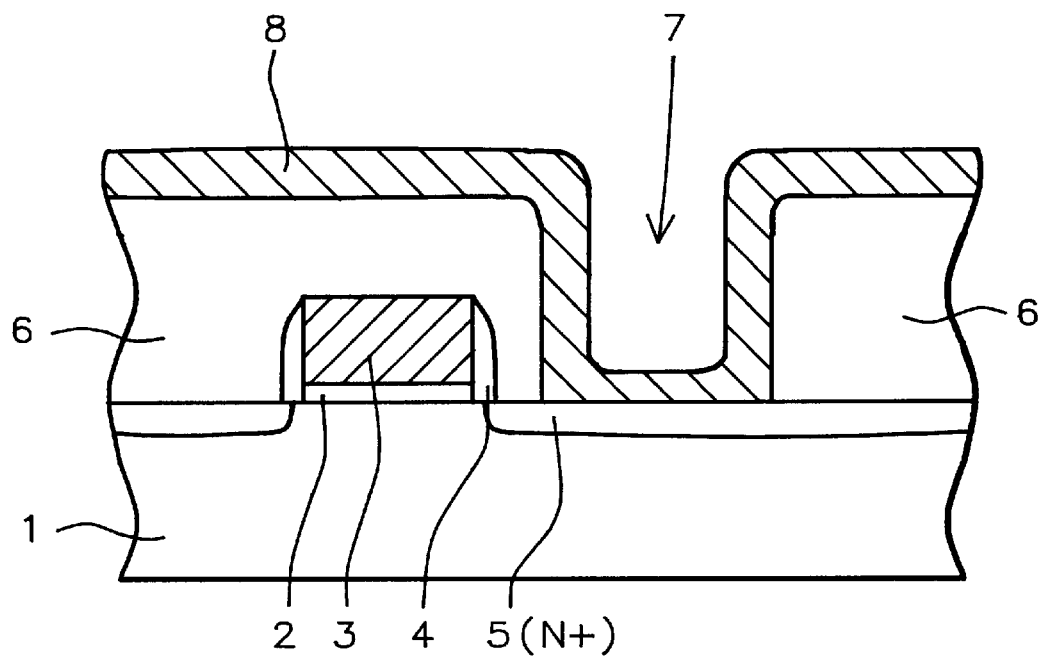
FIGS. 1–3, which schematically, in cross-sectional style, show the creation of HGS polysilicon, and the application of HSG polysilicon in a capacitor structure, of a DRAM device.

The method of forming HSG polysilicon, and the application of HSG polysilicon in a stacked capacitor, (STC), structure, of a DRAM device, will now be described in detail. FIG. 1, schematically shows the creation of a transfer gate transistor, and the bottom part of a storage node electrode, prior to the formation of the HSG polysilicon. Briefly, a semiconductor substrate 1, comprised of P type, single crystalline silicon, having a <100>, crystallographic orientation, is used. A gate insulator 2, comprised of silicon dioxide, obtained via thermal oxidation procedures, to a thickness between about 50 to 200 Angstroms, is next grown. A polysilicon layer is next deposited using low pressure chemical vapor deposition, (LPCVD), to a thickness between about 1500 to 4000 Angstroms. The polysilicon layer can be grown using in situ doping procedures, or grown intrinsically and doped via ion implantation procedures. Conventional photolithographic and reactive ion etching, (RIE), procedures, using C12 as an etchant are used to create polysilicon gate structure 3. After removal of the photoresist layer, used for patterning of polysilicon gate structure 3, insulator spacers 4, are created on the sides of polysilicon gate structure 3. Insulator spacers 4, are created by initially depositing a layer of silicon oxide, using LPCVD or plasma enhanced chemical deposition, (PECVD), procedures, to a thickness between about 1000 to 3000 Angstroms, followed by an anisotropic RIE procedure, using $CHF_3$ as an etchant.

N type source and drain regions 5, are next formed via ion implantation of either arsenic or phosphorous, followed by the deposition of silicon oxide layer 6, at a thickness between about 3000 to 8000 Angstroms, obtained via LPCVD or PECVD procedures. The result of these process steps are schematically shown in FIG. 1.

Photolithographic and RIE procedures, using $CHF_3$ as an etchant are next employed to open storage node contact hole 7, shown schematically in FIG. 1. After removal of the photoresist layer, used to define storage node contact hole 7, the first polysilicon layer 8, used for the creation of the STC structure, of the DRAM device, is deposited using LPCVD procedures, at a temperature between about 560 to 580° C., to a thickness between about 500 to 600 Angstroms. The first polysilicon layer can be deposited using in situ doping procedures, via the addition of either phosphine or arsine, to a silane source. The first polysilicon layer can also be deposited intrinsically, and doped via ion implantation procedures, using either arsenic or phosphorous.

Figure 2:
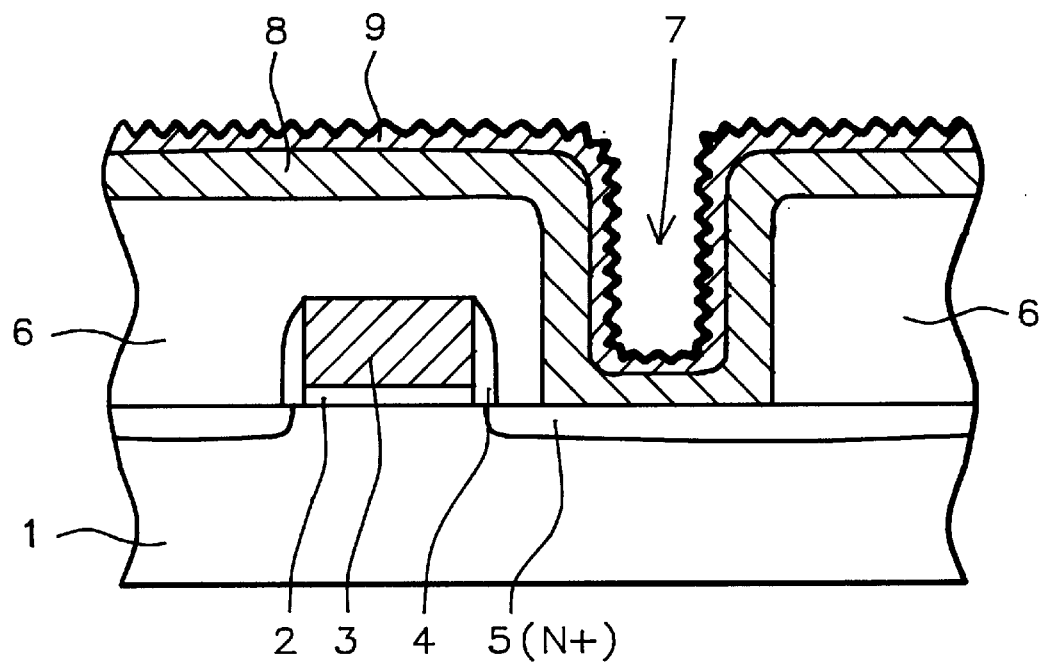

The objective of the invention, to create HSG polysilicon, is next addressed, and shown schematically in FIG. 2. An intrinsic, amorphous layer of silicon is first deposited, on the underlying polysilicon layer 8, at a temperature between about 490 to 550° C., to a thickness between about 600 to 1500 Angstroms, using LPCVD procedures, at a pressure between about 60 to 100 mTorr. An in situ anneal is next performed, at a temperature between about 600 to 650° C., at a pressure between about 0.5 to 1.5 mTorr, for a time between about 25 to 35 minutes. The result of these deposition and in situ anneal conditions create HSG polysilicon layer 9, schematically shown in FIG. 2, exhibiting the roughened surface, comprised on concave and convex features. HSG polysilicon layer 9, results in a surface increase allowing capacitance increases of about 50% to be realized, when the HSG polysilicon, presented in this invention, is used as the top surface material of an STC structure, used for 4 Mb DRAM devices. Plane plate test structures, fabricated using the HSG layer described in this invention, result in capacitance increases of about 100%, when compared to counterpart plane plate test structures, fabricated without the HSG layer, described in this invention.

Figure 3:
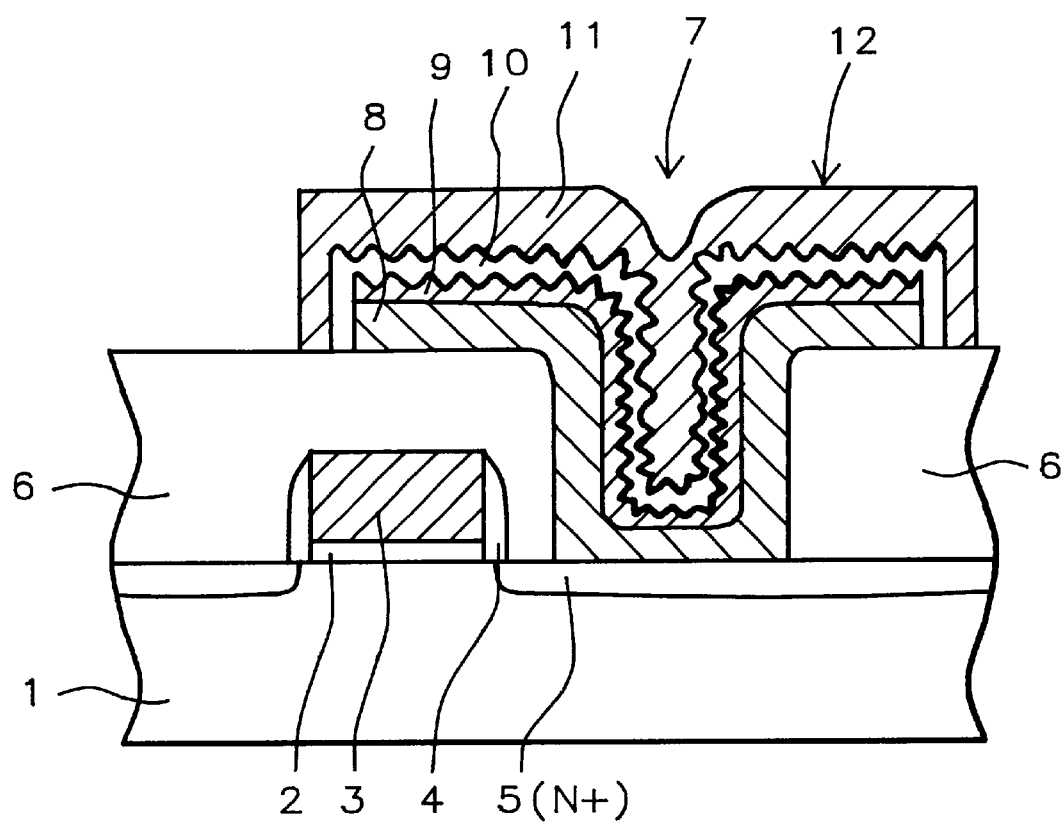

FIG. 3, schematically shows the final stages of fabrication, used to create an STC structure, using the HSG polysilicon described in this invention. The overlying HSG polysilicon layer 9, and the underlying polysilicon layer 8, are patterned to form the storage node structure, of a subsequent STC structure, using conventional photolithographic and RIE procedures, using $Cl_2$ as an etchant. After removal of the photoresist layer, a capacitor dielectric layer 10, is formed on the top surface of the HSG polysilicon layer 9. Capacitor dielectric layer 10, can be a composite dielectric layer of silicon oxynitride—silicon nitride—silicon oxide, (ONO), at an equivalent silicon oxide thickness of between about 50 to 80 Angstroms. This ONO layer is created by initially creating a native, silicon oxide layer, between about 10 to 20 Angstroms in thickness, on the HSG polysilicon layer 9. A thin layer of silicon nitride is next deposited, using LPCVD procedures, to a thickness between about 40 to 80 Angstroms. An oxidation procedure, performed in an oxygen-steam ambient, is next used to convert the surface of the silicon nitride layer, to a silicon oxynitride layer, thus creating the ONO layer.

After creation of capacitor dielectric layer 10, another polysilicon layer is deposited, via LPCVD procedures, at a temperature between about 560 to 580° C., to a thickness between about 1000 to 3000 Angstroms. The polysilicon layer can be grown using in situ doping techniques, or grown intrinsically and doped via ion implantation procedures, using arsenic or phosphorous. Conventional photolithographic and RIE procedure, using $Cl_2$ as an etchant are used to create upper electrode, or cell plate, 11, shown schematically in FIG. 3. Photoresist removal is once again performed, using plasma oxygen ashing and careful wet cleans, resulting in STC structure 12, featuring increased capacitor surface area, and thus increased capacitance, resulting from the use of a storage node electrode, comprised of an HSG polysilicon layer, described in this invention.

While this invention has been particularly shown and described with reference to the preferred embodiments thereof, it will be understood by those skilled in the art that various changes in form and details may be made without departing from the spirit and scope of the invention.

What is claimed is:

1. A method for fabricating a stacked capacitor structure, for a DRAM device, on a semiconductor substrate, wherein a surface area of the stacked capacitor structure is increased by using HSG polysilicon for the top layer of a storage node electrode, with said storage node electrode featuring a hemispherical grain silicon surface, obtained from a combination of materials and process steps that include an intrinsic amorphous silicon layer, deposited at a first temperature, deposited on an underlying doped polysilicon layer, then followed by an in situ anneal procedure, performed at a second temperature, greater than said first temperature, used for deposition of said amorphous silicon layer, and with said in situ anneal procedure performed at a low pressure, comprising the steps of:

providing a transfer gate transistor, including a storage node contact hole, opened in an insulator layer, exposing a source and drain region, in said semiconductor substrate;

depositing a thin first polysilicon layer, between about 500 to 600 Angstroms, on sides of, and on bottom of said storage node contact hole, contacting said source and drain region, located on bottom of said storage node contact hole, with said thin first polysilicon layer not completely filling said storage node contact hole;

depositing said intrinsic amorphous silicon layer, at a thickness between about 600 to 1500 Angstroms, at said first temperature, between about 490 to 550° C., on said thin first polysilicon layer, with said intrinsic amorphous silicon layer not completely filling said storage node contact hole;

in situ annealing, performed at said second temperature, between about 600 to 650° C., and at a pressure between about 0.5 to 1.5 mtorr, to convert said intrinsic amorphous silicon layer to a hemispherical grain, (HSG), polysilicon layer;

patterning of said HSG polysilicon layer, and of underlying, said thin first polysilicon layer, to create storage node electrode, for a stacked capacitor, (STC), structure;

forming a composite dielectric layer on the top surface of said HSG polysilicon layer;

depositing a second polysilicon layer; and patterning of said second polysilicon layer to create an upper electrode, for said STC structure.

2. The method of claim 1, wherein said transfer gate transistor is an N type, metal oxide semiconductor field effect transistor, (MOSFET), device, with a silicon oxide gate insulator layer, between about 50 to 200 Angstroms in thickness, and with N type source and drain regions.

3. The method of claim 1, wherein said transfer gate transistor is a P type, MOSFET device, with a silicon oxide gate insulator layer between about 50 to 200 Angstroms in thickness, and with P type source and drain regions.

4. The method of claim 1, wherein said thin first polysilicon layer is deposited using in situ doping, LPCVD procedures, at a temperature between about 560 to 580° C., to a thickness between about 500 to 600 Angstroms, using silane as the source and adding either arsine or phosphine.

5. The method of claim 1, wherein said thin first polysilicon layer is deposited intrinsically, using LPCVD procedures, at a temperature between about 560 to 580° C., to a thickness between about 500 to 600 Angstroms, and then doped via ion implantation procedures, using either arsenic or phosphorous.

6. The method of claim 1, wherein said amorphous silicon layer is deposited using LPCVD procedures, at said first temperature between about 490 to 550° C., at a pressure between about 60 to 100 mTorr, to a thickness between about 600 to 1500 Angstroms, using silane as a source.

7. The method of claim 1, wherein in situ anneal of said amorphous silicon layer is performed in the LPCVD tool, at said second temperature between about 600 to 650° C., and at a pressure between about 0.5 to 1.5 mTorr, for a time between about 25 to 35 minutes.

8. The method of claim 1, wherein the surface area of HSG polysilicon layer, used for a DRAM cell, is between about 50 to 75% greater than the surface area of said amorphous silicon layer, prior to the in situ anneal procedure, while the surface area of a plane plate test structure, fabricated with said HSG polysilicon layer, and subjected to the in situ anneal procedure, is increased by about 100%.

9. The method of claim 1, wherein said composite dielectric layer is composed of silicon oxynitride—silicon nitride—silicon oxide, obtained via: the growth of a native oxide on the top surface of said HSG polysilicon layer, at a thickness between about 10 to 20 Angstroms; LPCVD deposition of a silicon nitride layer, to a thickness between about 40 to 80 Angstroms; and an oxidation to convert the top portion of said silicon nitride layer, to a silicon oxynitride layer.

10. The method of claim 1, wherein said second polysilicon layer is deposited using LPCVD procedures, at a temperature between about 560 to 580° C., to a thickness between about 1000 to 3000 Angstroms, using in situ deposition procedures via the addition of either arsine or phosphine, to the silane source.

11. The method of claim 1, wherein said second polysilicon layer is deposited intrinsically, using LPCVD procedures, at a temperature between about 560 to 580° C., to a thickness between about 1000 to 3000 Angstroms, and doped via ion implantation of either arsenic or phosphorus.

* * * * *